United States Patent
Ye et al.

(10) Patent No.: US 11,276,562 B2
(45) Date of Patent: Mar. 15, 2022

(54) PLASMA PROCESSING USING MULTIPLE RADIO FREQUENCY POWER FEEDS FOR IMPROVED UNIFORMITY

(71) Applicant: Applied Materials, Inc., Santa Clara, CA (US)

(72) Inventors: Zheng John Ye, Santa Clara, CA (US); Ganesh Balasubramanian, Sunnyvale, CA (US); Thuy Britcher, San Jose, CA (US); Jay D. Pinson, II, San Jose, CA (US); Hiroji Hanawa, Sunnyvale, CA (US); Juan Carlos Rocha-Alvarez, San Carlos, CA (US); Kwangduk Douglas Lee, Redwood City, CA (US); Martin Jay Seamons, San Jose, CA (US); Bok Hoen Kim, San Jose, CA (US); Sungwon Ha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/807,156

(22) Filed: Mar. 2, 2020

(65) Prior Publication Data
US 2020/0203132 A1    Jun. 25, 2020

Related U.S. Application Data

(62) Division of application No. 14/539,914, filed on Nov. 12, 2014, now Pat. No. 10,580,623.

(60) Provisional application No. 61/906,388, filed on Nov. 19, 2013.

(51) Int. Cl.
| | | |
|---|---|---|
| H01L 21/00 | (2006.01) | |
| C23C 16/00 | (2006.01) | |
| H01J 37/32 | (2006.01) | |
| C23C 16/509 | (2006.01) | |

(52) U.S. Cl.
CPC ...... *H01J 37/32577* (2013.01); *C23C 16/509* (2013.01); *H01J 37/32091* (2013.01)

(58) Field of Classification Search
CPC ................................................. H01J 37/32577
See application file for complete search history.

(56) References Cited

U.S. PATENT DOCUMENTS

| | | |
|---|---|---|
| 6,424,232 B1 | 7/2002 | Mavretic et al. |
| 6,462,481 B1 | 10/2002 | Holland et al. |
| 6,518,195 B1 | 2/2003 | Collins et al. |
| 6,962,644 B2 | 11/2005 | Paterson et al. |
| 7,411,148 B2 | 8/2008 | Kwon et al. |

(Continued)

*Primary Examiner* — Sylvia Macarthur
*Assistant Examiner* — Michelle Crowell
(74) *Attorney, Agent, or Firm* — Patterson + Sheridan, LLP

(57) ABSTRACT

A system for modifying the uniformity pattern of a thin film deposited in a plasma processing chamber includes a single radio-frequency (RF) power source that is coupled to multiple points on the discharge electrode of the plasma processing chamber. Positioning of the multiple coupling points, a power distribution between the multiple coupling points, or a combination of both are selected to at least partially compensate for a consistent non-uniformity pattern of thin films produced by the chamber. The power distribution between the multiple coupling points may be produced by an appropriate RF phase difference between the RF power applied at each of the multiple coupling points.

17 Claims, 12 Drawing Sheets

(56) References Cited

U.S. PATENT DOCUMENTS

| | | | |
|---|---|---|---|
| 8,312,839 B2* | 11/2012 | Baek | C23C 16/509 |
| | | | 118/723 MW |
| 8,829,468 B2 | 9/2014 | Keller et al. | |
| 2003/0052085 A1 | 3/2003 | Parsons | |
| 2004/0194709 A1 | 10/2004 | Yamagishi et al. | |
| 2005/0173070 A1 | 8/2005 | Lee | |
| 2008/0061901 A1 | 3/2008 | Gilmore | |
| 2009/0159423 A1 | 6/2009 | Kudela et al. | |
| 2009/0202741 A1 | 8/2009 | Stimson et al. | |
| 2009/0255798 A1* | 10/2009 | Furuta | H01J 37/3244 |
| | | | 204/157.15 |
| 2010/0006142 A1* | 1/2010 | Li | H01J 37/32577 |
| | | | 136/252 |
| 2010/0009096 A1* | 1/2010 | Kawamura | C23C 16/509 |
| | | | 427/569 |
| 2010/0015357 A1 | 1/2010 | Hanawa et al. | |
| 2010/0080933 A1 | 4/2010 | Kudela et al. | |
| 2010/0095888 A1* | 4/2010 | Mori | H05H 1/46 |
| | | | 118/663 |
| 2010/0104772 A1 | 4/2010 | Kudela et al. | |
| 2010/0193128 A1 | 8/2010 | Koumura et al. | |
| 2010/0239757 A1* | 9/2010 | Murata | C23C 16/509 |
| | | | 427/255.28 |
| 2011/0001430 A1* | 1/2011 | Ko | H01J 37/32541 |
| | | | 315/111.21 |
| 2011/0049102 A1* | 3/2011 | Kroll | H01J 37/32357 |
| | | | 216/71 |
| 2011/0192349 A1 | 8/2011 | Hammond, IV et al. | |
| 2013/0071581 A1 | 3/2013 | Baek et al. | |
| 2013/0119854 A1 | 5/2013 | Lane et al. | |
| 2013/0248798 A1 | 9/2013 | Yi et al. | |
| 2013/0337657 A1 | 12/2013 | Savas et al. | |
| 2014/0109832 A1 | 4/2014 | Kim et al. | |

* cited by examiner

PLASMA PROCESSING USING MULTIPLE RADIO FREQUENCY POWER FEEDS FOR IMPROVED UNIFORMITY

CROSS-REFERENCE TO RELATED APPLICATIONS

This application is a divisional of U.S. patent application Ser. No. 14/539,914, filed Nov. 12, 2014, which claims benefit of U.S. Provisional Patent Application Ser. No. 61/906,388, filed Nov. 19, 2013, which are both herein is incorporated by reference.

BACKGROUND OF THE INVENTION

Field of the Invention

Embodiments of the present invention relate generally to semiconductor substrate processing and, more particularly, to plasma processing in a plasma processing chamber having one or more radio frequency power feeds for improved process uniformity.

Description of the Related Art

Plasma processing, such as plasma-enhanced chemical vapor deposition (PECVD), is generally employed to deposit thin films on substrates, such as semiconductor substrates, solar panel substrates and liquid crystal display (LCD) substrates. Uniformity of such thin films, both in thickness and quality, is generally desired and, as substrates increase in size, is increasingly difficult to attain. In fact, as the size of semiconductor devices formed with these films continues to decrease, the requirements for thickness uniformity and other film properties often become even more stringent.

Asymmetries inherent in the configuration of many chemical vapor deposition reactors can further compound difficulties in achieving thin film uniformity. For example, for many PECVD chambers used to process semiconductor substrates (e.g., 300 mm diameter substrates), the layout is generally configured to be cylindrically symmetrical to facilitate a cylindrically symmetrical electric field in the chamber during processing. However, the presence of a slit valve formed in one wall of the chamber for insertion and removal of substrates necessarily disrupts this symmetry and can result in film thickness skew that varies from one side of the chamber to an opposite side of the chamber. In addition, connection of the radio-frequency power feed at a center point of a PECVD chamber discharge electrode, while conducive to producing a radially uniform electric field, can be inaccessible due to the presence of other external chamber components that prevent the connection at the center point of the electrode. Thus, a radio-frequency power feed for some PECVD chambers may be positioned on the discharge electrode at some point besides the geometric center, which is generally suboptimal with respect to generating a radially symmetric electric field in the chamber. Non-symmetric electric fields will generally cause a plasma generated in the processing region of a processing chamber to be non-uniform, which will cause the deposition or etching process performed in the processing chamber to be non-uniform.

Accordingly, there is a need in the art for systems and methods that facilitate improved uniformity of an etching process or a thin film deposition process performed in a plasma processing chamber.

SUMMARY OF THE INVENTION

One or more embodiments of the present invention provide systems for modifying the uniformity pattern of a thin film deposited in a plasma processing chamber. A single radio-frequency (RF) power source is coupled to multiple points on the discharge electrode of the plasma processing chamber. Positioning of the multiple coupling points, a power distribution between the multiple coupling points, or a combination of both are selected to at least partially compensate for a consistent non-uniformity pattern of thin films produced by or etched within the processing chamber. According to some embodiments, the power distribution between the multiple coupling points is produced by an appropriate RF phase difference between the RF power applied at each of the multiple coupling points.

Embodiments of the invention may further provide a plasma processing chamber comprising a radio frequency power supply configured to operate at a first substantially fixed frequency during operation, a first transmission line that electrically couples the radio frequency power supply to a first surface of a discharge electrode of the plasma processing chamber at a first location, and a second transmission line that electrically couples the radio frequency power supply to the first surface of the discharge electrode at a second location that is different than the first location, wherein the discharge electrode includes a second surface that faces a substrate processing region of the plasma processing chamber.

Embodiments of the invention may further provide a multiple chamber plasma processing system comprising a plasma processing chamber that includes a radio frequency power supply configured to operate at a first substantially fixed frequency during operation, a first transmission line that electrically couples the radio frequency power supply to a first surface of a discharge electrode of the plasma processing chamber at a first location, and a second transmission line that electrically couples the radio frequency power supply to the first surface of the discharge electrode at a second location that is different than the first location, wherein the discharge electrode includes a second surface that faces a substrate processing region of the plasma processing chamber, and wherein the first location and the second location are selected to at least partially compensate for a consistent non-uniformity pattern of thin films produced by the plasma processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

One or more embodiments of the present invention provide systems for modifying the uniformity of a thin film deposited and/or etched in a plasma processing chamber. Positioning and control of the power delivered to one or more coupling points is used to at least partially compensate for a consistent plasma non-uniformity that can affect the deposition or etching pattern formed on a substrate in a processing chamber. According to some embodiments, the power distribution between the multiple coupling points is produced by an appropriate RF phase difference between the RF power applied at each of the multiple coupling points.

Figure 1:
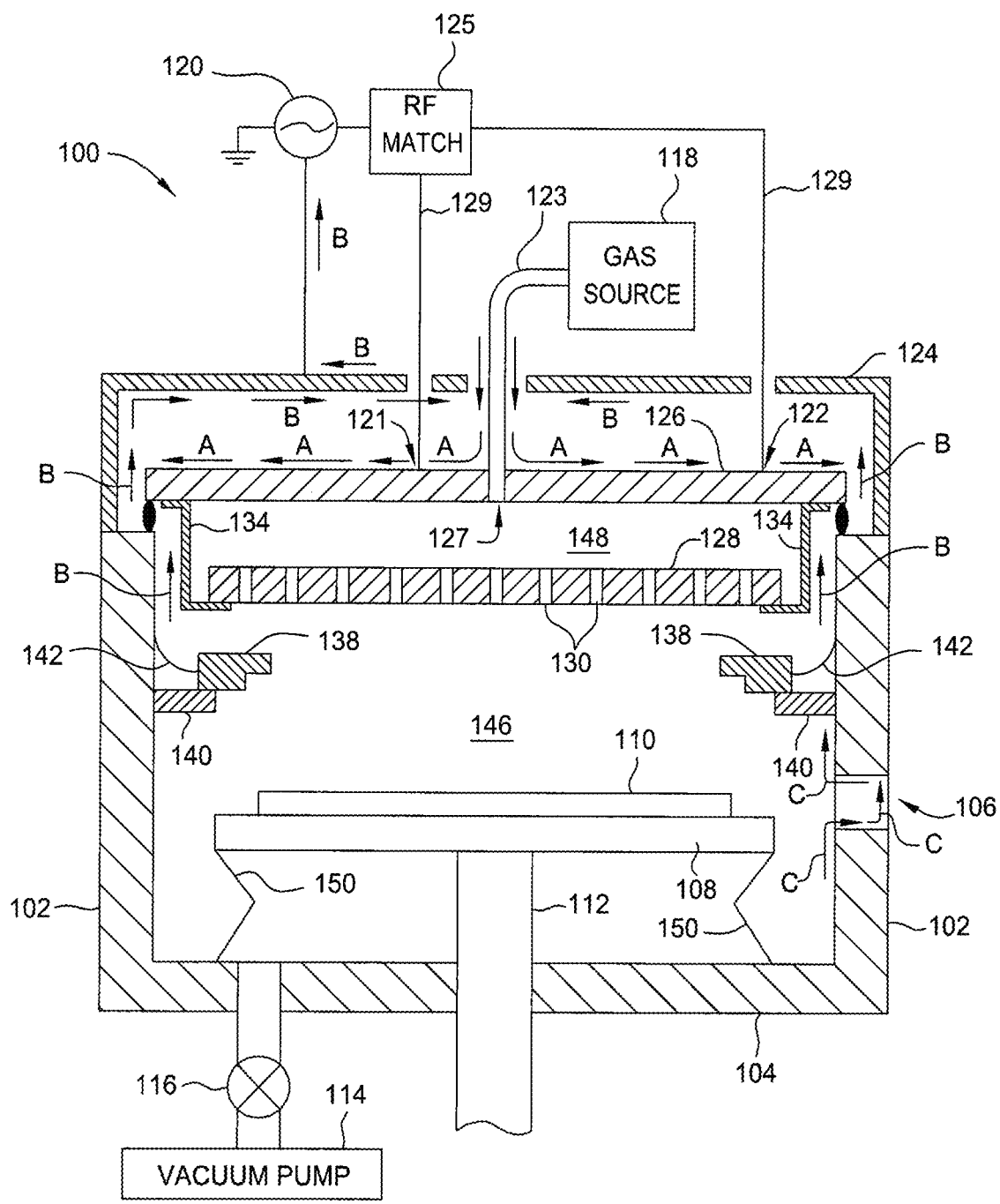
FIG. 1 is a schematic cross sectional view of a plasma processing chamber configured according to one embodiment of the present invention.

FIG. 1 is a schematic cross sectional view of a plasma processing chamber 100 configured according to one embodiment of the present invention. Plasma processing chamber 100 may be any technically feasible plasma deposition or etch chamber that includes a capacitively coupled plasma system for generating plasma therein, including a plasma-enhanced chemical vapor deposition (PECVD) system, a physical vapor deposition system, an epitaxial layer deposition system, a plasma etch system, and the like. By way of example, an embodiment of plasma processing chamber 100 is described in terms of a PECVD system, but any other plasma processing chamber may fall within the scope of the present invention. Plasma processing chamber 100 includes walls 102, a bottom 104, and a chamber lid 124 that together enclose a susceptor 108 and a processing region 146. Plasma processing chamber 100 further includes a vacuum pump 114, a gas source 118, and a radio-frequency (RF) power source 120, each coupled externally to plasma processing chamber 100.

Walls 102 and bottom 104 may comprise an electrically conductive material, such as aluminum or stainless steel. Disposed in plasma processing chamber 100 is a shadow frame 138 that is configured to prevent or reduce unwanted deposition from occurring on surfaces of susceptor 108 that are not covered by substrate 110 during processing. Shadow frame 138 rests on a ledge 140 when plasma processing chamber 100 is idle, and may be coupled by one or more straps 142 to an inside surface of walls 102. Through one or more of walls 102, a slit valve opening 106 may be present that is configured to facilitate insertion of a substrate 110 into and removal of substrate 110 from plasma processing chamber 100. A slit valve configured to seal slit valve opening 106 may be disposed either inside or outside of plasma processing chamber 100. For clarity, a slit valve is not shown in FIG. 1.

Vacuum pump 114 is coupled to plasma processing chamber 100 and is configured to adjust the vacuum level therein. As shown, a valve 116 may be coupled between plasma processing chamber 100 and vacuum pump 114. Vacuum pump 114 evacuates plasma processing chamber 100 prior to substrate processing and removes process gas therefrom during processing through valve 116. Valve 116 may be adjustable to facilitate regulation of the evacuation rate of plasma processing chamber 100. The evacuation rate through valve 116 and the incoming gas flow rate from gas source 118 determine chamber pressure and process gas residency time in plasma processing chamber 100.

Susceptor 108 may include any technically feasible apparatus for supporting a substrate during processing by plasma processing chamber 100, such as substrate 110 in FIG. 1. In some embodiments, susceptor 108 includes one or more heating elements for heating substrate 110 during processing. In some embodiments, susceptor 108 is disposed on a shaft 112 that is configured to raise and lower susceptor 108. In one embodiment, shaft 112 and susceptor 108 may be formed at least in part from an electrically conductive material, such as aluminum or stainless steel. In embodiments in which plasma processing chamber 100 is a capacitively coupled plasma chamber, susceptor 108 may be configured as one of the two electrodes disposed on opposite sides of processing region 146.

Gas source 118 is coupled to plasma processing chamber 100 via a tube 123 that passes through chamber lid 124. Tube 123 is coupled to a backing plate 126 to permit processing gas to pass through the backing plate 126 and enter a plenum 148 between backing plate 126 and a gas distribution showerhead 128. Gas distribution showerhead 128 may be held in place adjacent to backing plate 126 by a suspension 134, so that gas distribution showerhead 128, backing plate 126, and suspension 134 together form an assembly sometimes referred to as a gas box. In some embodiments, tube 123, backing plate 126, gas distribution showerhead 128, and/or suspension 134 may be formed at least in part from an electrically conductive material. For example, tube 123, backing plate 126, and gas distribution showerhead 128 may comprise a metal, such as aluminum or stainless steel. Thus, during operation, processing gas introduced into plasma processing chamber 100 from gas source 118 fills plenum 148 and then passes through gas passages 130 formed in gas distribution showerhead 128 to uniformly enter processing region 146. In alternative embodiments, process gas may be introduced into processing region 146 via inlets and/or nozzles (not shown) that are attached to the wall 102 in addition to or in lieu of gas distribution showerhead 128.

RF power source 120 may be any technically feasible RF power generator configured to drive plasma generation in plasma processing chamber 100, and, in one embodiment, is coupled to backing plate 126 at coupling points 121 and 122 via one or more transmission lines 129. Thus, coupling points 121 and 122 act as RF power feed points to backing plate 126. Transmission lines 129 may include coaxial cables and, in some embodiments, are configured with additional shielding external to these coaxial cables to prevent excessive leakage of RF power to ground. In one embodiment, RF power source 120 includes an RF power source capable of generating RF currents at a frequency of about 13.56 MHz. In another embodiment, the RF power source 120 includes a VHF power source capable of generating VHF power, such VHF power at frequencies between about 40 MHz to 200 MHz or more. In one example, the RF power source 120 includes a VHF power source capable of generating VHF power at frequencies between about 40 MHz to 60 MHz.

In some embodiments, RF power source 120 provides high frequency power through an optional RF match 125 (also referred to as an impedance match) to a discharge electrode disposed adjacent processing region 146. Such a discharge electrode may be configured as a process gas distribution element, such as gas distribution showerhead 128 (as shown in FIG. 1), or an array of gas injection nozzles, through which process gases are introduced into processing region 146. The discharge electrode, i.e., gas distribution showerhead 128, may be oriented substantially parallel to the surface of substrate 110 and capacitively couples plasma source power into processing region 146, which is disposed between substrate 110 and gas distribution showerhead 128. During processing susceptor 108, shadow frame 138 and substrate 110 are raised and positioned near to the lower surface of the showerhead 128 (e.g., 1-30 mm) to form the at least partially enclosed processing region 146. In some embodiments susceptor 108 and/or the shadow frame 138 are electrically grounded, and in other embodiments substrate support 203 is instead electrically coupled to RF power source 120 or additional RF power source (not shown), so that energy (e.g., power) can be delivered to the processing region 146 from one or more sides.

It is noted that because gas tube 123 is typically fed substantially into a center point 127 of backing plate 126 to improve gas flow uniformity into plenum 148, since delivering a precursor gas or an etching gas non-symmetrically to the gas distribution showerhead 128 typically leads to gas flow non-uniformity, thereby affecting the uniformity of the etch or deposition process performed in the plasma processing chamber 100. In addition, other external chamber components may interfere with or obstruct access to center point 127. Thus, the center point 127 is not generally available for an RF power connection. Consequently, RF current cannot be delivered to the backing plate 126 at the center point 127. Instead, according to embodiments of the invention, coupling points 121 and/or 122, which supply RF current to backing plate 126 and gas distribution showerhead 128, are each positioned to couple RF power to gas backing plate 126 so that a consistent non-uniformity pattern of thin films produced by, or etched within, the plasma processing chamber 100 is altered. Specifically, the positions of coupling points 121 and 122 may be selected so that a particular non-uniformity pattern can be at least partially compensated for. In this way, uniformity of a thin film deposited on substrate 110 can be significantly improved without varying more conventional process parameters, such as chamber pressure, substrate temperature, RF power, and the like, and without modifying components inside plasma processing chamber 100.

PECVD is generally performed in plasma processing chamber 100 by placing substrate 110 on susceptor 108 and introducing one or more precursor gases from gas source 118 into processing region 146. The precursor gas or gases in processing region 146 are energized (e.g., excited) into a plasma state by applying RF power to gas distribution showerhead 128 via coupling points 121 and 122. This type of plasma is typically referred to as capacitively coupled plasma (CCP) due to the nature of the electron heating mechanism being predominately through the capacitive plasma sheaths near gas distribution showerhead 128 and the ground electrode holding substrate 110 (e.g., susceptor 108 or wall 102). The excited gas reacts to form a layer of material on a surface of substrate 110. In some embodiments, the susceptor 108 is electrically coupled to one or more of walls 102, thereby providing an RF current returning path to RF power source 120, so that the RF current travels along an RF path from RF power source 120 and returns thereto.

Thus, during operation, RF current from power source 120 flows to backing plate 126 via coupling points 121 and 121, through and/or along surfaces of backing plate 126, then down suspension 134 to the surface of gas distribution showerhead 128 that faces the substrate 110, as shown by arrows "A." The RF current couples through the plasma that is generated during processing in processing region 146 to susceptor 108, then travels along the susceptor 108. The RF current seeks the shortest path to return to the source driving it. For example, if the shadow frame is conductive, the RF current may flow along shadow frame 138 and straps 142 to walls 102 when shadow frame 138 contacts susceptor 108. In other cases, the RF current may travel along susceptor 108 to straps 150 that couple susceptor 108 to chamber bottom 104 and shorten the RF return path. The RF current then flows along walls 102 and lid 124 and back to power source 120 as shown by arrows "B" to complete the RF circuit.

Walls 102 may be configured as a cylinder, so that plasma processing chamber 100 is substantially cylindrically symmetrical. In this way, an electric field generated by gas distribution showerhead 128 during processing is encouraged to be relatively symmetrical about center point 127 (FIG. 1). However, due to the presence of slit valve opening 106 in walls 102 and/or other features in the chamber, the return path "B" of RF current is not truly symmetric about center point 127. Instead, in the portion of walls 102 that include slit valve opening 106, RF current travels in a less direct path "C" than RF in the portions of walls 102 that do not include slit valve opening 106. Thus, RF current following path "C" along wall 102 has a longer inductive path, and greater ohmic losses, than RF current returning to power source 120 following the more direct path "B." This lack of uniformity in RF return path can significantly affect the shape of the electric field in processing region 146, causing the generated plasma to be unevenly distributed in processing area 146. In addition, because RF power typically cannot be coupled to backing plate 126 at center point 127, the shape of the electric field in processing region 146 can be further distorted. With uneven plasma distribution, a non-uniform deposition of material onto the substrate 110 or etching of material from the substrate 110 may occur.

In some embodiments, plasma processing chamber 100 may also include a machine-compatible controller configured to control the operation of plasma processing chamber 100, including output power level of RF power source 120, flow rate of the various process gases directed to processing region 146 via gas source 118, adjustment of valve 116, etc. Generally such a controller includes one or more processors, memory, and instructions suitable for controlling the operation of plasma processor chamber 100. Alternatively, in some embodiments, a system controller configured to control operation of a multi-chamber processing system may instead be configured to control the operation of plasma processing chamber 100, as well as one or more other processing chambers.

According to embodiments of the present invention, positioning of the coupling points 121 and 122, a power distribution between the coupling points 121 and 122, or a combination of both are selected to at least partially compensate for a consistent non-uniformity pattern of thin films produced by plasma processing chamber 100. For example, the positioning of the coupling points 121 and 122 and/or additional coupling points can be used to generate an electric field pattern that is complimentary to an existing uniformity pattern consistently measured on substrates processed by plasma processing chamber 100. FIGS. 2A-2D illustrate various examples of such embodiments.

Figure 2A:
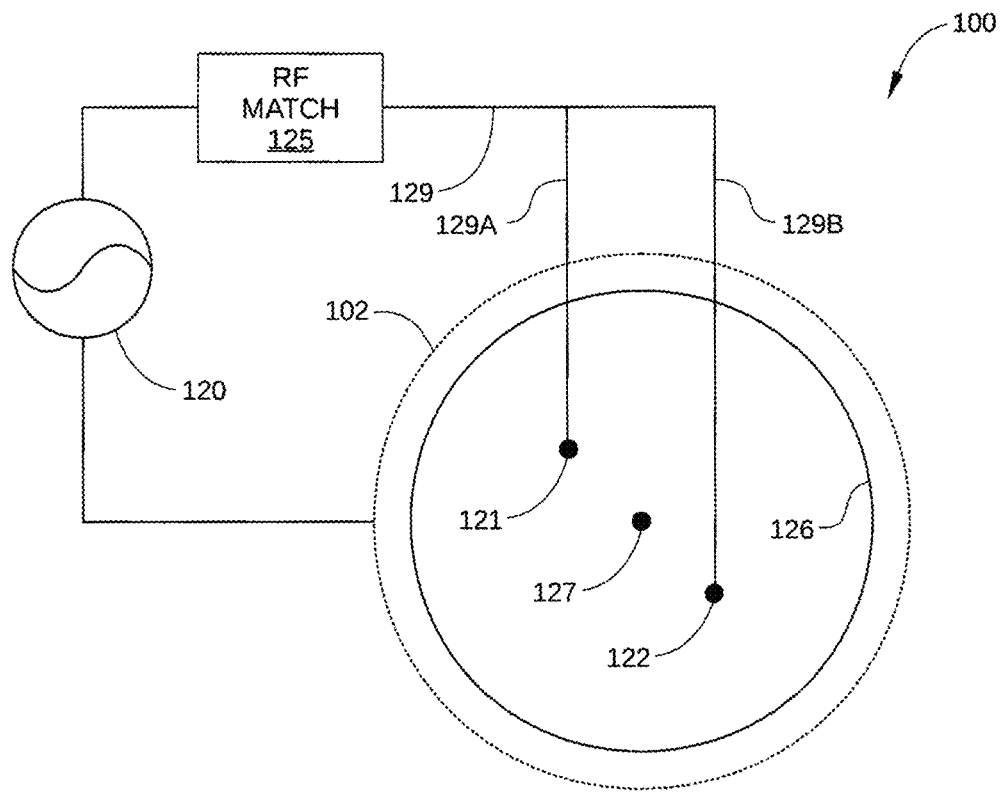
FIGS. 2A-D are schematic plan views of a backing plate of the plasma processing chamber in FIG. 1, configured according to various embodiments of the present invention.
Figure 2B:
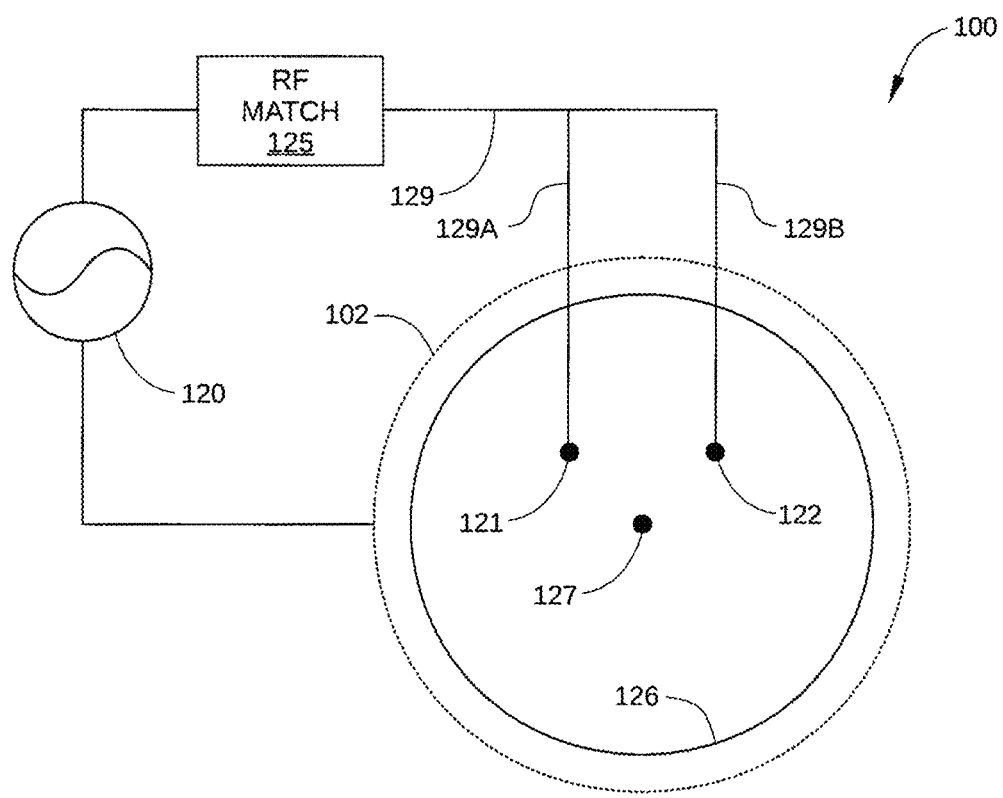

FIGS. 2A-D are schematic plan views of backing plate 126 of plasma processing chamber 100, configured according to various embodiments of the present invention. FIGS. 2A-D also schematically illustrate walls 102, RF power source 120, and RF match 125. As shown in FIG. 2A, coupling points 121 and 122 are electrically coupled at different positions on backing plate 126, so that the single RF power source 120 is electrically coupled thereto at multiple locations via transmission lines 129, 129A, and 129B. It is noted that in the embodiment illustrated in FIG. 2A, neither of coupling points 121 or 122 are disposed at center point 127. In some embodiments, coupling points 121 and 122 are disposed on backing plate 126 at locations that are symmetrical about center point 127, as shown in FIG. 2A. In such embodiments, skewed film uniformity may be compensated for, i.e., when uniformity patterns of film thickness or other properties consistently vary from one side of plasma processing chamber 100 to an opposite side of plasma processing chamber 100. Alternatively, in some embodiments, coupling points 121 and 122 are electrically coupled to backing plate 126 at locations that are asymmetrical about center point 127, as shown in FIG. 2B. In such embodiments, other film uniformity issues may be compensated for, such as when uniformity patterns of one or more film thickness or other properties consistently exhibit a more complex non-uniformity pattern. For example, a pattern that is a combination of uniformity issues, such as having side-to-side skew and being center-thick may be compensated for.

Figure 2C:
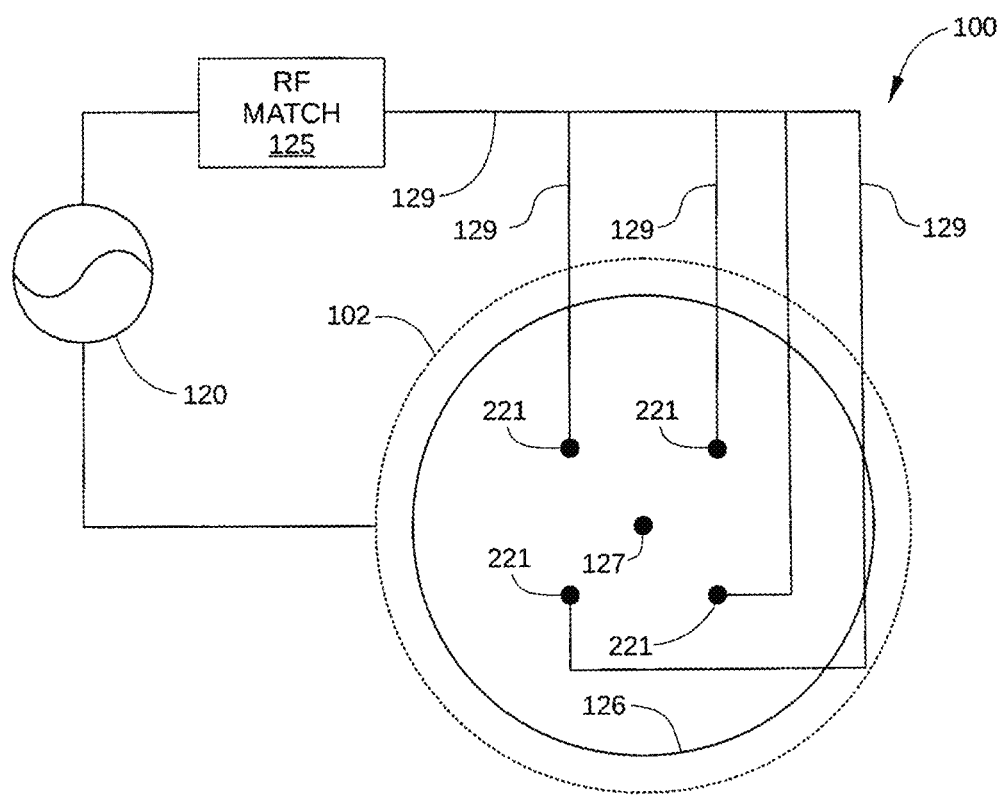
Figure 2D:
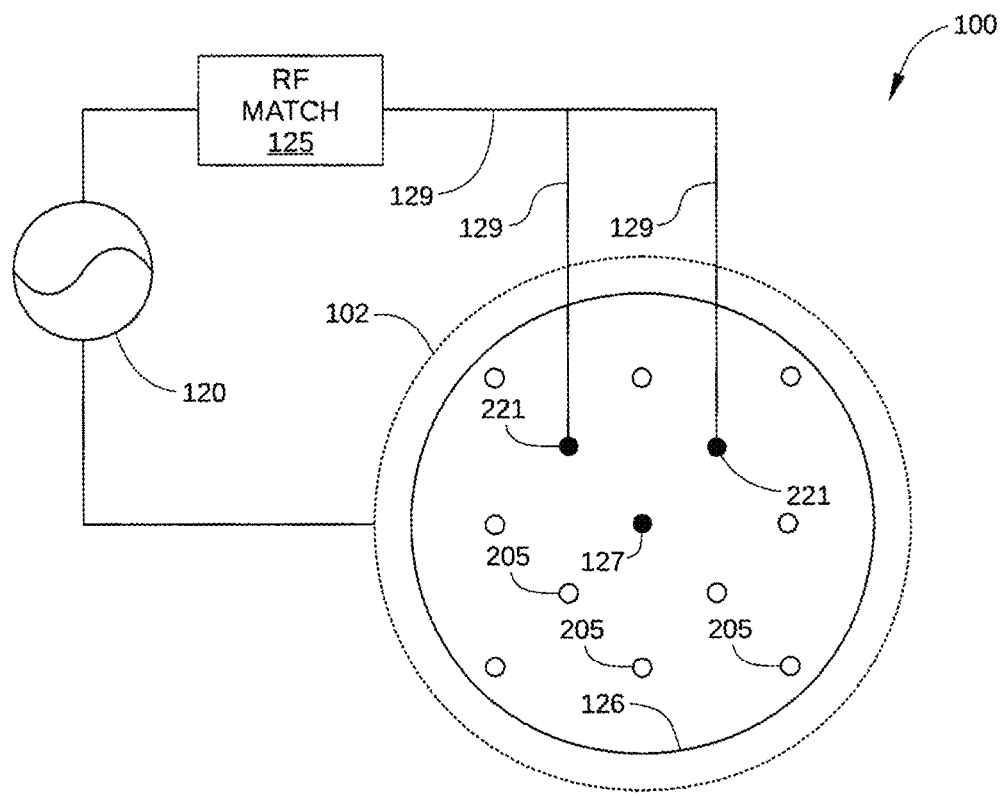

In some embodiments, more than just two coupling points may be used to electrically couple RF power source 120 to backing plate 126. For example, in some embodiments three or more coupling points 221 may be used, as shown in FIGS. 2C and 2D. In some embodiments, the multiple coupling points 221 may be arranged substantially symmetrically about center point 127, as shown in FIG. 2C. In some embodiments, the multiple coupling points 221 may be arranged substantially asymmetrically about center point 127, as shown in FIG. 2D, for example to better compensate for inherent asymmetries in plasma processing chamber 100 that generate more complex patterns of non-uniformity on processed substrates than simply skew. In some embodiments, backing plate 126 includes a plurality of additional or auxiliary coupling points 205 that are disposed at different locations, thereby providing additional locations at which transmission lines 129 may be electrically coupled to backing plate 126. In such embodiments, auxiliary coupling points 205 facilitate repositioning of one or more of transmission lines 129 to better compensate for consistent uniformity patterns on substrates processed by plasma processing chamber 100. Any other configuration of multiple coupling points used to electrically couple RF power source to backing plate 126, whether symmetrically or asymmetrically positioned, falls within the scope of the invention.

The embodiments described above in conjunction with FIGS. 2A-D refer to electrically coupling transmission lines to backing plate 126 in various configurations. However, this configuration is not intended to be limiting as to the scope of the invention described herein, since the transmission lines may instead be coupled to any component in plasma processing chamber that acts as a discharge electrode for driving or generating a plasma in the processing region of the chamber and/or any other component that is electrically coupled to such a discharge electrode. For instance, in some embodiments, transmission lines 129 in FIG. 1 may be coupled to suspension 134 and/or gas distribution showerhead 128 instead of or in addition to backing plate 126. Furthermore, any other descriptions herein of coupling transmission lines to a backing plate of a plasma processing chamber are equally applicable to any component in plasma processing chamber that acts as, or is electrically coupled to, a portion of a discharge electrode for driving or generating a plasma in the processing region of the chamber and/or any component that is electrically coupled to such a discharge electrode.

Figure 3:
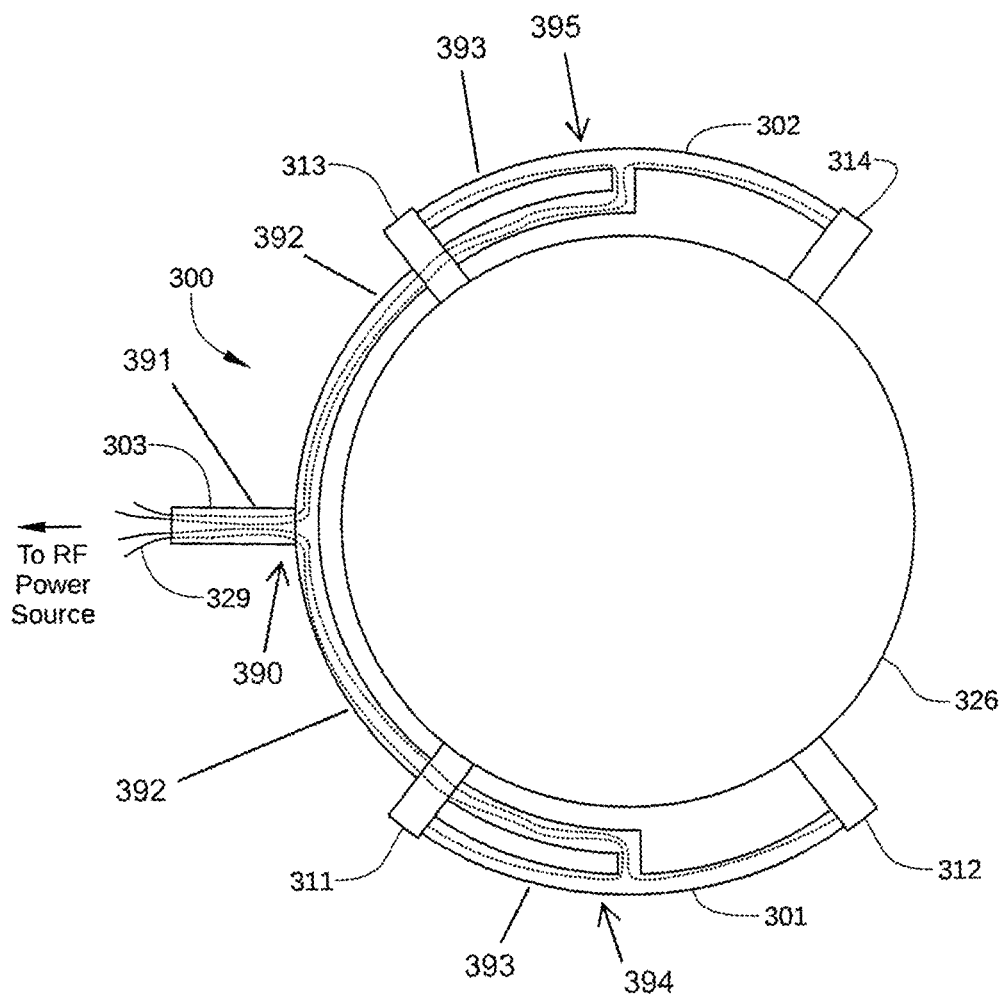
FIG. 3 is a schematic plan view of a portion of the plasma generation system of a plasma processing chamber, according to an embodiment of the present invention.

In some embodiments, a transmission line structure is configured to implement edge delivery of RF power to showerhead 128, such as via a backing plate of a plasma processing chamber. The use of an edge delivery configuration can facilitate a process of easily reconfiguring the transmission lines connected to the backing plate to alter the plasma uniformity in the processing chamber. FIG. 3 illustrates one such embodiment. FIG. 3 is a schematic plan view of a transmission line structure 300 and a backing plate 326, configured according to an embodiment of the present invention. Backing plate 326 may be similar in configuration and operation to backing plate 126 in FIG. 1. Transmission line structure 300 includes a first removable ring segment 301, a second removable ring segment 302, a single deliver point 303, and coupling points 311-314.

In one embodiment, a single deliver point 303 can be coupled to one or more transmission lines 329 from an RF power supply, such as RF power supply 120 in FIG. 1. Use of a single delivery point 303 is less complex to manufacture and install than a multiple delivery point design using conventional methods, due, for example, to the need to control the connection lengths to prevent high reflected powers and other RF related problems. However, single delivery point designs that do not deliver RF power at a point of symmetry in the processing chamber will typically create significant plasma non-uniformities due to the non-symmetric RF power delivery. In one embodiment, the first removable ring segment 301 is configured to contain and route one or more transmission lines 329, to coupling points 311 and 312. Similarly, second removable ring segment 302 is configured to contain and route one or more transmission lines 329 to coupling points 313 and 314. In addition, first removable ring segment 301 and second removable ring segment 302 may be configured to include additional shielding that is used to shield the conductor in the transmission lines 329.

In some embodiments, the transmission line structure 300, or even the first removable ring segment 301 and/or second removable ring segment 302, is configured for easy installation and removal, so that the number and location of coupling points 311-314 can be modified without extensive disassembly of the plasma processing chamber. For example, first removable ring segment 301 may be replaced with a different removable ring segment that is configured to route a transmission line from single deliver point 303 to a different number of coupling points than the two coupling points.

In another embodiment of the transmission line structure 300, as also illustrated in FIG. 3, the RF power supply 120 is connected to a single deliver point 303 that is coupled to a conducting transmission line assembly 390. In this configuration, the conducting transmission line assembly 390 may comprise a plurality of conducting elements that are used to connect the single delivery point 303 to the coupling points. For example, the conducting transmission line assembly 390 may include a conducting element 391, a first branch conducting element 392 and second branch conducting elements 393, wherein the conducting element 391 is coupled to the single deliver point 303 and the ends of the second branch conducting elements 393 are separately coupled to a coupling point 311, 312, 313 or 314. If only two coupling points are used in a plasma processing configuration, then the conducting transmission line assembly 390 may only comprise a conducting element 391 and a first branch conducting element 392, which is coupled to conducting element 391 and two separate coupling points (e.g., coupling points 311 and 313, coupling points 311 and 314, etc.). In one example, during processing the RF power delivered to the single delivery point 303 can be delivered through the conducting element 391, the different legs of the first branch conducting element 392, the second branch conducting elements 393, which are found in the separate ring segments 394 and 395, and then to the coupling points 311-314. In general, a conducting transmission line assembly 390 includes a single solid conducting structure that can be easily mounted on and removed from a portion of the plasma processing chamber 100. In one example, the single solid conducting structure may be formed from a metal sheet, metal plate or welded solid conducting elements (e.g., silver or gold coated copper pieces) that are shielded from ground by use of an electrical RF shielding material (not shown) and/or shape of the structure. As is further discussed below in conjunction with the transmission lines 329, by adjusting the length of each of the conducting elements 391-393, the cross-section of each of the conducting elements 391-393, the position of the connections between conducting elements (e.g., conducting elements 391-393), and the position of the connections points 311-314 on the plasma processing chamber 100, the amount of power and phase difference of the RF power delivered to the processing region through each of the connection points can be configured to provide a more uniform plasma in the processing region of the plasma processing chamber during processing.

Figure 4:
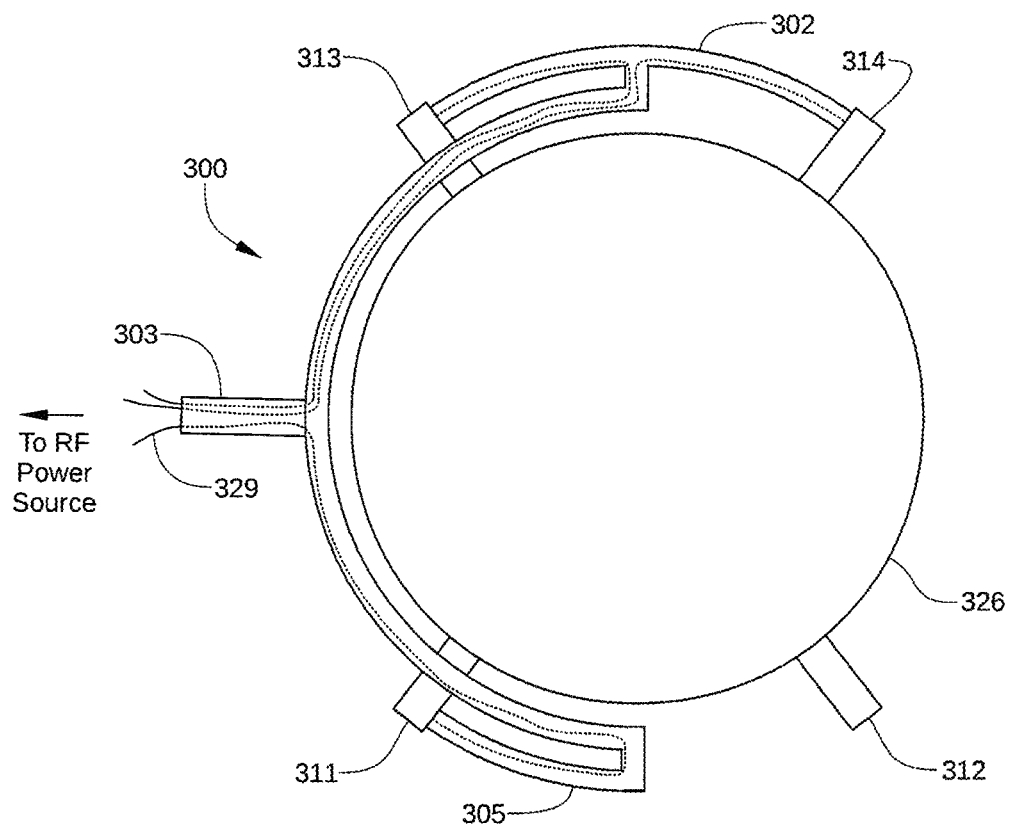
FIG. 4 is a schematic plan view of a portion of the plasma generation system of a plasma processing chamber, according to an embodiment of the present invention.

FIG. 4 illustrates a processing chamber configuration after the complete transmission line structure 300, or just the first removable ring segment 301, has been replaced so that the new transmission line structure 300 includes a second removable ring segment 302 and a modified removable ring segment 305. As shown, modified removable ring segment 305 is configured to route transmission lines from single deliver point 303 to a single coupling point (e.g., coupling point 311). Thus, by replacing the transmission line structure 300, or just the first removable ring segment 301 with the modified removable ring segment 305, the configuration of transmission lines 329 coupled to backing plate 326 is changed from four RF power feeds that are substantially symmetrically arranged about the edge of backing plate 326 to three RF power feeds that are asymmetrically arranged about the edge of backing plate 326. In this way, the RF power delivery configuration in a plasma processing chamber, such as plasma processing chamber 100, may be easily adjusted for different processes by changing the number and location of coupling points to backing plate 326. In some prior art designs, a single edge delivery coupling point has been used to deliver a transmission line from an RF power source to a backing plate of a plasma processing chamber. Such a configurations generally produce a significant skew in film thickness due to the asymmetrical delivery of RF energy to the backing plate.

Figure 5:
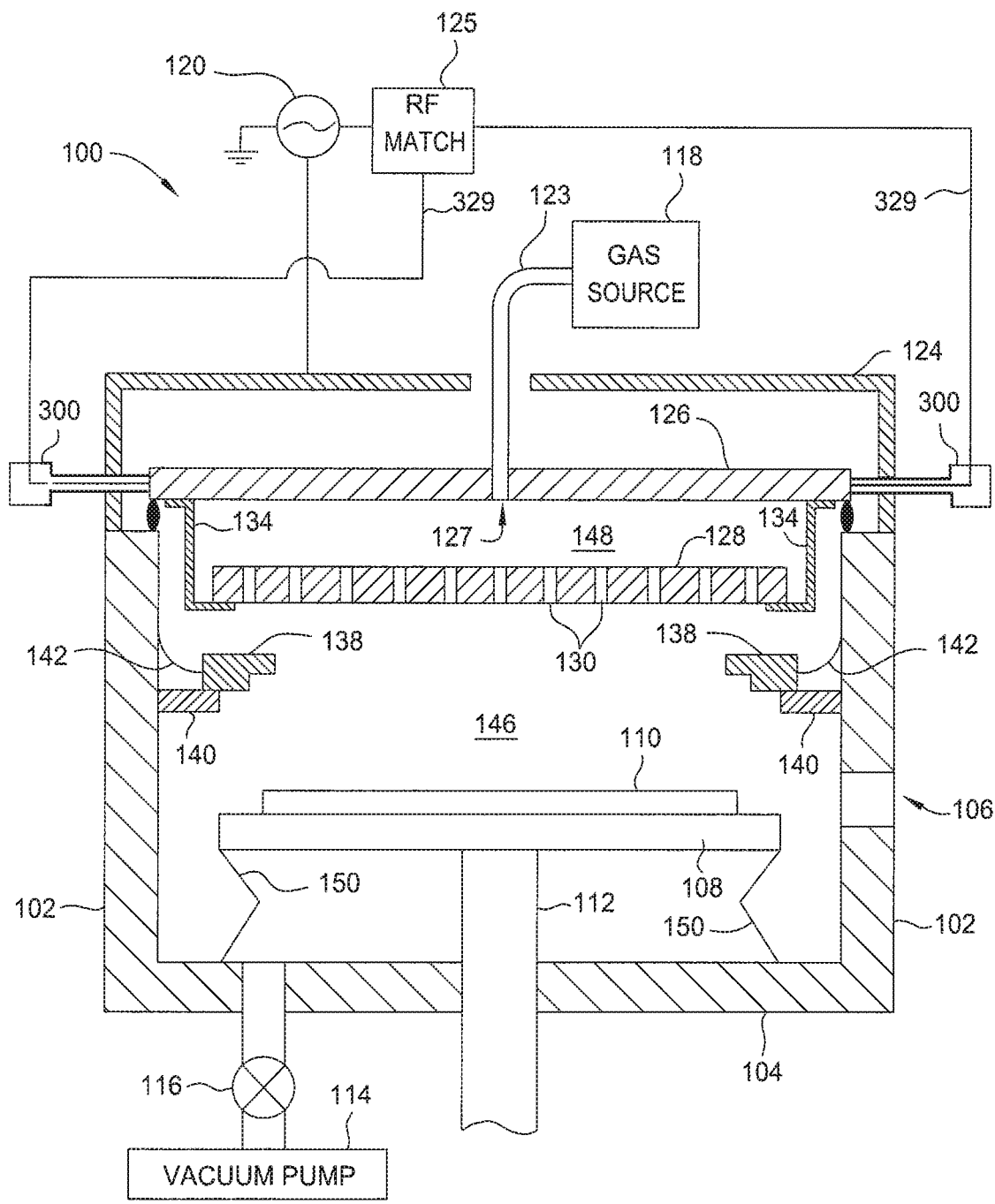
FIG. 5 is a schematic cross sectional view of a plasma processing chamber configured according to one embodiment of the present invention.

FIG. 5 is a schematic cross sectional view of a plasma processing chamber 500 configured with transmission line structure 300, according to one embodiment of the present invention. Plasma processing chamber 500 may be substantially similar in configuration and operation to plasma processing chamber 100 in FIG. 1, but with the addition of transmission line structure 300. As shown, transmission line structure 300 may be disposed adjacent to chamber lid 124 and outside of plasma processing chamber 500. In addition, transmission lines 329, or conducting elements 391-393, are routed inside transmission line structure 300 to one or more edges of backing plate 126. Because transmission line structure 300 is mounted to an outer side surface of plasma processing chamber 100, transmission line structure 300 is generally not in close proximity to gas delivery system components such as tube 123 and gas source 118. Consequently, removal, replacement, and/or modification of transmission line structure 300 typically does not involve partial or complete disassembly of the gas delivery system, and can be performed without venting plasma processing chamber 100 or any gas delivery components thereof to atmosphere.

In the embodiments illustrated in FIGS. 1-5, a substantially cylindrical plasma processing chamber is depicted. However, embodiments of the present invention are not limited to cylindrical chambers and the processing of circular substrates. In other embodiments, a plasma processing chamber may be rectangular or square and be configured to process rectangular or square substrates.

To couple RF power source 120 to multiple locations on backing plate 126, multiple transmission lines 129 are used, and these multiple transmission lines may be configured to each have substantially the same length. For example, in FIG. 2A, transmission line 129A, which couples coupling point 121 to RF power source 120, may substantially the same length as transmission line 129B, which couples coupling point 122 to RF power source 120. Consequently, the electrical path from RF power source 120 to coupling point 121 is substantially the same as the electrical path from RF power source 120 to coupling point 122. Another example is illustrated in FIG. 3. As shown, transmission line structure 300 is configured so that transmission lines 329, or conducting transmission line assembly 390 (e.g., conducting elements 391-393), are not routed directly to each of coupling points 311-314. Instead, the transmission line 329 that is routed to coupling point 311 separates from the transmission line 329 that is routed to coupling point 312 at a midpoint of first removable ring segment 301. In this way, the transmission lines 329 routed to coupling points 311 and 312 therefore have substantially the same length, even though coupling point 311 is disposed closer to single deliver point 303 than coupling point 312. Likewise, the transmission lines 329 routed to coupling points 313 and 314 are configured with substantially the same length, even though coupling point 313 is disposed closer to single deliver point 303 than coupling point 314. In this way, the electrical path length of transmission lines 329 can be substantially equal, and RF power delivered to each of coupling points 311-314 is therefore mutually in phase.

In some embodiments, the multiple transmission lines 129 used to couple RF power source 120 to multiple locations on backing plate 126 may each have a different length. For example, as shown in FIG. 2A, transmission line 129A, which couples coupling point 121 to RF power source 120, may be significantly shorter than transmission line 129B, which couples coupling point 122 to RF power source 120. Consequently, the electrical path from RF power source 120 to coupling point 121 is significantly shorter than the electrical path from RF power source 120 to coupling point 122. Therefore, in some configurations, it may be desirable to provide a non-uniform plasma in the processing region of the processing chamber, due to the difference in electric path length of the transmission lines, to counteract a plasma non-uniformity created by characteristics of the processing chamber or plasma generating electrodes in the processing chamber.

In some embodiments, transmission line 129A and transmission line 129B are each selected to have substantially the same electrical length. That is, the difference in the physical length of transmission line 129A and transmission line 129B is substantially equal to an integral number of wavelengths of the RF power being transmitted therein, so that power delivered to backing plate 126 at coupling points 121 is substantially in phase with power delivered to backing plate 126 at coupling points 122. Furthermore, transmission line 129A may be split from transmission line 129B at a point where the characteristic impedance is substantially uniform along the propagation direction. The characteristic impedance of transmission line 129A and 129B can be determined based on the mechanical dimensions and conductive and dielectric material properties of each. In such embodiments, a substantially concentric electric field pattern may be obtained in plasma processing chamber 100 even though RF power is not coupled directly to center point 127 of backing plate 126. This is because RF power delivered at each coupling point is substantially in phase and constructive interference from each of coupling points 121 and 122 generally prevent or greatly reduce radial variation of RF current or power delivered to plasma formed in the processing region during processing.

In some embodiments, the physical length of transmission lines 129A and the physical length of transmission line 129B are not equal, but are selected to have substantially the same electrical length, where electrical length of each is based on the frequency of RF power source 120. In other embodiments one or more phase adjustment devices are used to adjust the electrical length of transmission line 129A and/or transmission line 129B. Thus, by changing the phase of transmission line 129A with respect to transmission line 129B, the electrical length of one can be adjusted relative to the electrical length of the other. Various embodiments of suitable phase adjustment devices are describe in greater detail below.

In some embodiments, a variable electric field pattern in plasma processing chamber 100 is generated by coupling RF power source 120 to backing plate 126 via multiple coupling points and then implementing a phase difference in the RF power applied at each of the multiple coupling points. A difference in phase between any of the multiple coupling points creates either constructive or destructive interference in plasma processing chamber 100, leading to electric field pattern changes that can compensate for plasma asymmetries already present in plasma processing chamber 100 and thereby generating substantially uniform plasma across the surface of a substrate being processed. Such phase differences between different coupling points can be implemented with various devices that are external to plasma processing chamber 100, and are described below. In addition, such phase differences can effectively create a power distribution between each of the multiple coupling points.

Furthermore, in some embodiments, both the phase and the amplitude of RF power that is coupled to backing plate 126 from a single RF power source to multiple RF power feed points can be modulated to generate desired electric field patterns in plasma processing chamber 100. For example, coefficients acting as multiplication factors for individual power level control for any particular RF power feed, and the phase relation between any two RF power feeds as well as the entire phase relationship among all RF power feeds can be controlled precisely by the controller for plasma processing chamber 100 via such phase modulation to generate either constructive interference or destructive interference for the purpose of supporting a strong or weak electric field along certain direction, or in certain regions above the substrate being processed. A particular desired electric field pattern to be generated in this way may be determined using theoretical calculation and/or three-dimensional modeling, as well as experimental optimization processes. One example of such a desired electric field pattern is that of high electric field near the substrate edge and low electric field level proximate the substrate center. In addition, in some embodiments, a particular field pattern can be implemented that intentionally achieves a non-uniform electric field and/or plasma pattern for a particularly desirable film thickness and property map. Thus, any use of electric field superposition through alternating power between multiple RF feeds to an RF showerhead or backing plate thereof are considered within the general scope of the present invention.

Figure 6:
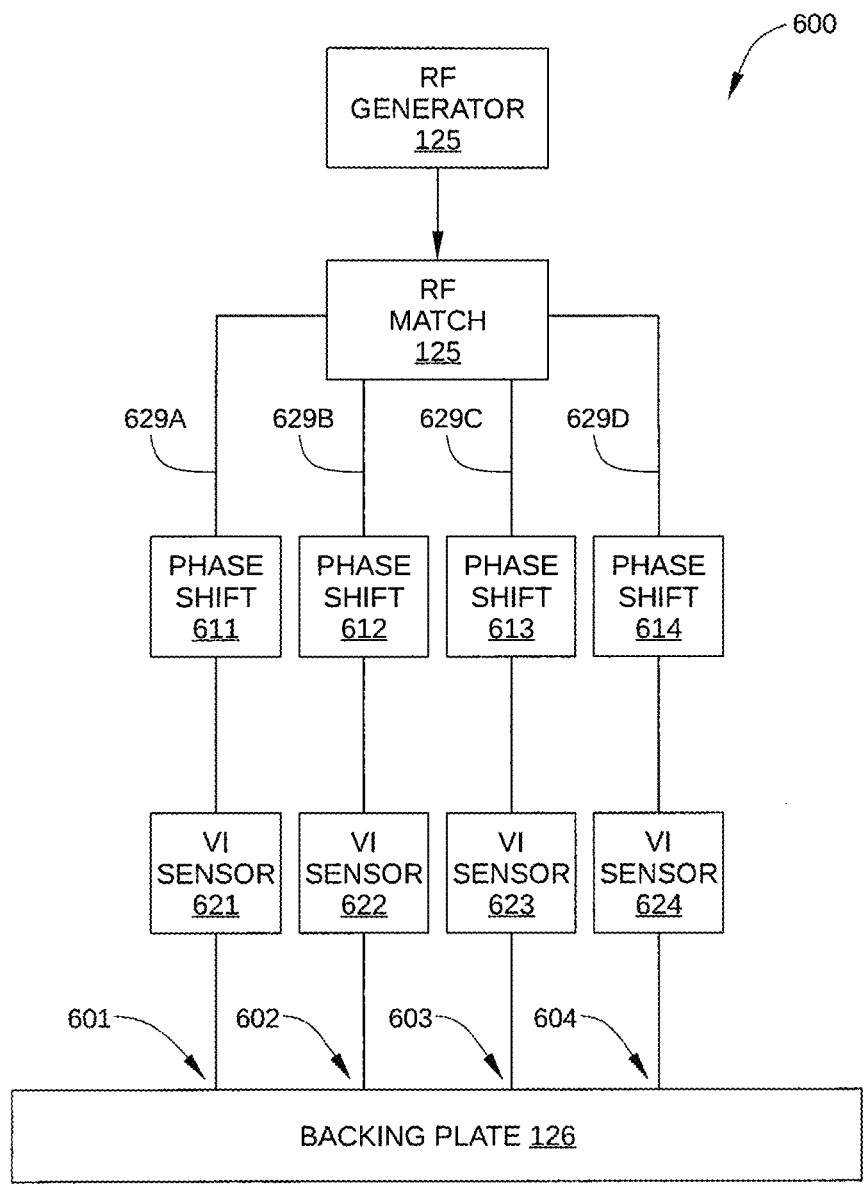
FIG. 6 is a schematic diagram of a plasma generation system, according to an embodiment of the present invention.

FIG. 6 is a schematic diagram of a plasma generation system 600 of plasma processing chamber 100, configured according to an embodiment of the present invention. Plasma generation system 600 is configured to implement a suitable phase difference between two or more of coupling points 601-604 that are disposed on backing plate 126 to improve thickness uniformity and/or other properties of a thin film formed on a substrate by plasma processing chamber 100. Plasma generation system 600 includes RF power source 120, RF match 125, phase shifters 611-614, voltage-current (VI) sensors 621-624, and backing plate 126. Suspension 134, gas distribution showerhead 128, and susceptor 108 (all shown in FIG. 1) may also be considered part of plasma generation system 600, but are omitted in FIG. 6 for clarity.

As shown, RF power source 120 is coupled to RF match 125 via transmission line 129, and RF match 129 is coupled to each of coupling points 601-604 on backing plate 126 via multiple transmission lines 629A-D, respectively. Installed in-line on transmission lines 629A-D are phase shifters 611-614 respectively and, in some embodiments, VI sensors 621-624 respectively. By implementing a phase offset between any of coupling points 601-604 using phase shifters 611-614, the electric field pattern and/or generated plasma uniformity in plasma processing chamber 100 can be adjusted or tuned to a desired configuration without the replacement, removal, or modification of the components of plasma processing chamber 100. As noted previously, such an electric field pattern and/or generated plasma uniformity can be selected to compensate for uniformity patterns that are repeatably produced on thin films deposited on a substrate by plasma processing chamber 100.

While the embodiment illustrated in FIG. 6 includes four phase shifters 611-614, as few as two phase shifters or more than four may be used in other embodiments and still be sufficient to generate suitable interference. In addition, a symmetrical or asymmetrical distribution of the coupling points 601-604 of the multiple transmission lines to backing plate 126 may be used. Furthermore, phase shifters 611-614 and/or VI sensors 621-624 may be integrated into RF match 125 rather than implemented as separate components as shown in FIG. 6.

Phase shifters 611-614 may be configured to either mechanically or electrically produce a desired phase shift at each of coupling points 601-604. In some embodiments, phase shifters 611-614 are configured to mechanically alter the electrical length of transmission lines 629A-D, respectively. For example, each of phase shifters 611-614 may include a mechanical phase shifter such as a so-called trombone line stretcher, which is a device well-known in the art for adjusting the electrical separation between two RF components. Any other mechanism that can be used to adjust electrical length, such as a rolling contact device that alter the path length of the delivered RF current, may also be used for phase shifters 611-614. Such mechanical phase shifters are generally best suited for scenarios in which a relatively small phase shift (e.g., ±10°) is implemented between coupling points 601-604. In other embodiments, phase shifters 611-614 are configured to electrically alter the electrical length of transmission lines 629A-D, respectively. For example, each of phase shifters 611-614 may include a phase shifter circuit or other electrical apparatus configured to alter the electrical length of a transmission line.

Figure 7:
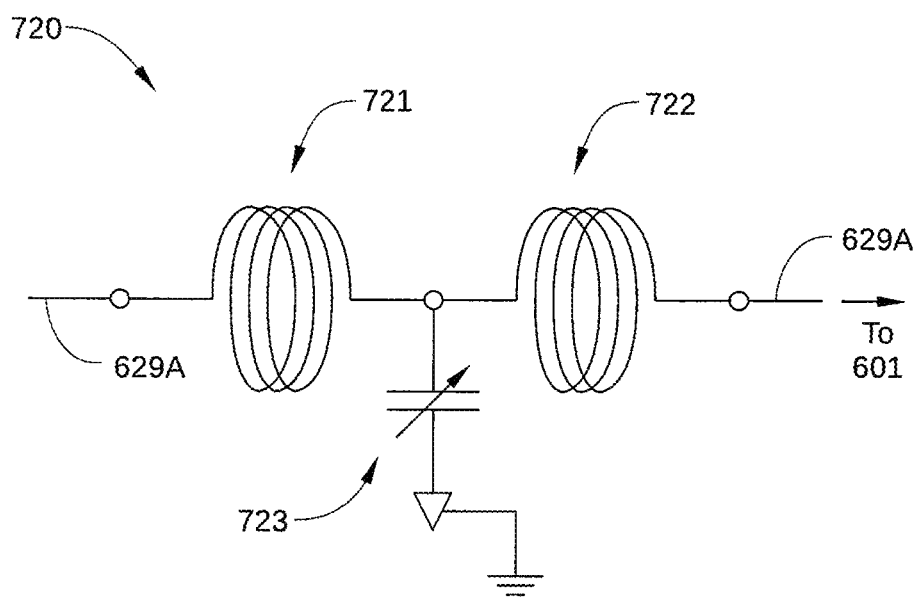
FIG. 7 schematically illustrates one embodiment of a phase shifter circuit that may be used as part of the plasma generation system, according to an embodiment of the invention.

FIG. 7 schematically illustrates one embodiment of a phase shifter circuit that may be used as part of plasma generation system 600, according to an embodiment of the invention. FIG. 7 illustrates a circuit 720 configured to adjust the phase of RF power delivered to backing plate 126 at coupling point 601, such as phase shifter 611. Circuit 720 includes a first coil 721, a second coil 722, and an adjustable capacitor 723. As shown, first coil 721 and second coil 722 are disposed in-line in transmission line 629A, and adjustable capacitor 723 may be coupled to electrical ground. Adjustment of adjustable capacitor 723 shifts the phase of RF power transmitted via transmission line 629A. Adjustable capacitor 723 may be mechanically adjusted, thereby providing a substantially fixed phase adjustment once an adjustment to adjustable capacitor 723 is set.

Alternatively, in some embodiments, circuit 720 may include variable circuit elements for adjusting the phase of RF power transmitted via transmission line 629A electronically in real time. In such embodiments, transmission line 629A may include a VI sensor, such as VI sensor 621 in FIG. 6, to provide instantaneous feedback so that a controller for plasma processing chamber 100 can control the variable capacitance of circuit 720. Furthermore, in such embodiments, variation of the phase of RF power being transmitted via one or more of transmission lines 629A-D can be varied over time to produce a particular time-averaged superposition of RF power feeds to coupling points 601-604 that provide desired electric field and plasma uniformity behavior in plasma processing chamber 100.

In previously described embodiments, the superposition of RF power delivered from multiple RF feeds from a single RF power source at a fixed RF frequency is used to alter electric field and plasma pattern in a plasma-processing chamber to achieve a particular film thickness and property uniformity map. In some embodiments, such a superposition of the RF power delivered from multiple RF feeds may be applied to a plasma processing chamber that uses multiple-frequency plasma processing. One such embodiment is illustrated in FIG. 8.

Figure 8:
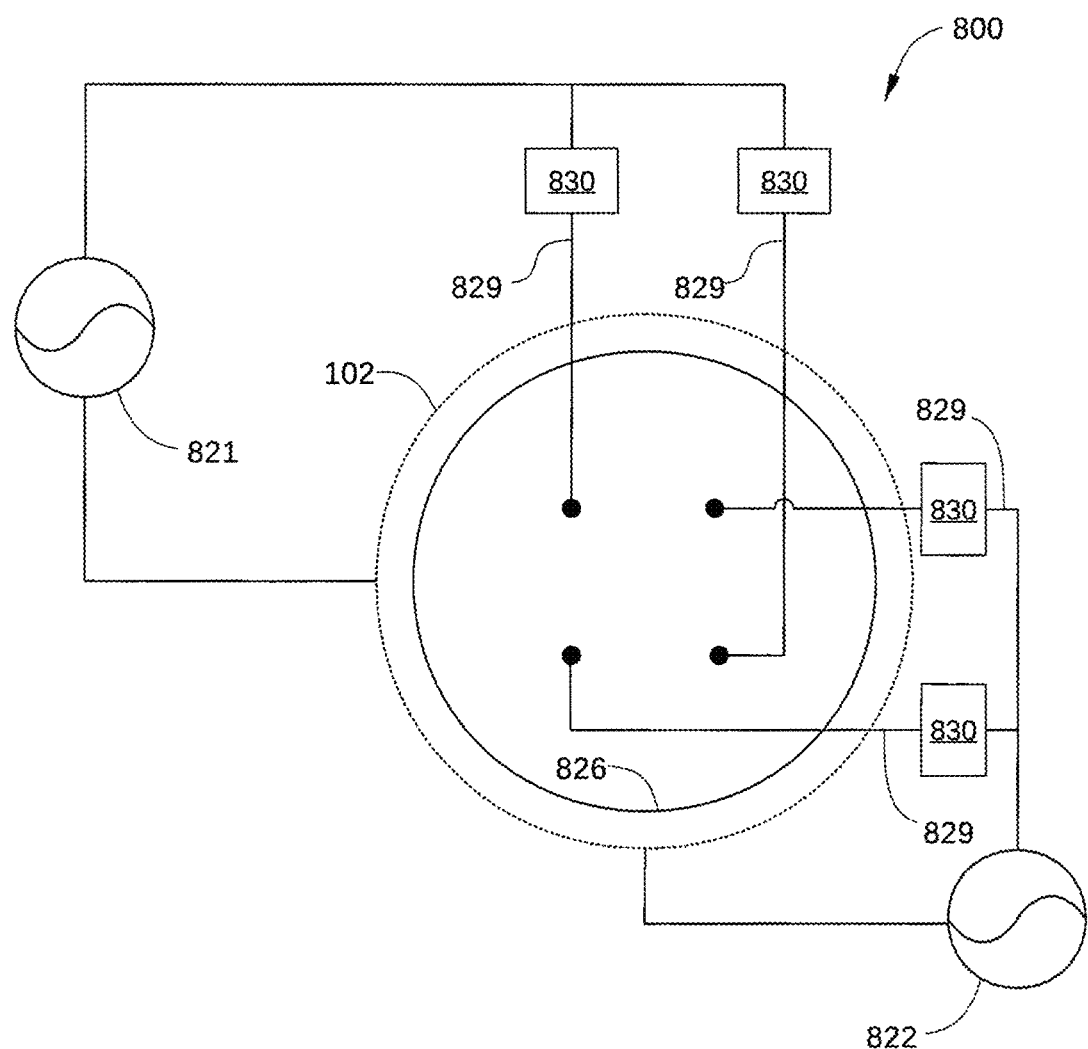
FIG. 8 is schematic plan view of a backing plate of a plasma-processing chamber, configured according to various embodiments of the present invention.

FIG. 8 is schematic plan view of a backing plate 826 of a plasma-processing chamber 800, configured according to various embodiments of the present invention. FIG. 8 also illustrates walls 102, a first RF power source 821, and a second RF power source 822. Backing plate 826 may be similar in configuration and operation to backing plate 126 in FIG. 1. As shown in FIG. 8, first RF power source 821 and second RF power source 822 are each coupled to backing plate 826 via multiple transmission lines 829. In addition, first RF power source 821 and second RF power source 822 include a phase shifter 830, which may be substantially similar to circuit 720 in FIG. 7. First RF power source 821 may be a low frequency RF power source, for example 400 kHz, and second RF power source 822 may be a higher frequency RF power source, for example 2 MHz.

Each RF power source is coupled to backing plate 826 via multiple transmission lines 829, consequently the phase and amplitude of RF power that is coupled to backing plate 826 from each RF power source can be modulated independently to generate desired electric field patterns in plasma processing chamber 800 for different effects. For instance, lower frequency RF power generally affects voltage in plasma processing chamber 800, whereas higher frequency RF power generally affects plasma density in plasma processing chamber 800. Because some processes are sensitive to plasma density and some are sensitive to voltage, plasma processing chamber 800 allows the adjustment of voltage distribution and plasma density distribution substantially independently. Specifically, a phase offset in the RF power coupled to backing plate 826 from first RF power source 821 can be used to generate a particular voltage distribution in plasma processing chamber 800 and a phase offset in the RF power coupled to backing plate 826 from second RF power source 822 can be used to generate a particular plasma density distribution in plasma processing chamber 800. For example, voltage distribution in plasma processing chamber 800 can be adjusted to be center high while at the same time plasma distribution can be adjusted to be center low. Thus, for film properties affected by low frequency RF, such as stress uniformity, first RF power source 821 can be used to generate a first uniformity pattern, and for film properties affected by higher frequency RF, such as thickness uniformity, second RF power source 822 can be used to generate a second uniformity pattern. In this way, varying conventional process control parameters may not be needed, such as substrate temperature, chamber pressure, and RF power, or these parameters may only be needed for fine-tuning a particular process.

Figure 9:
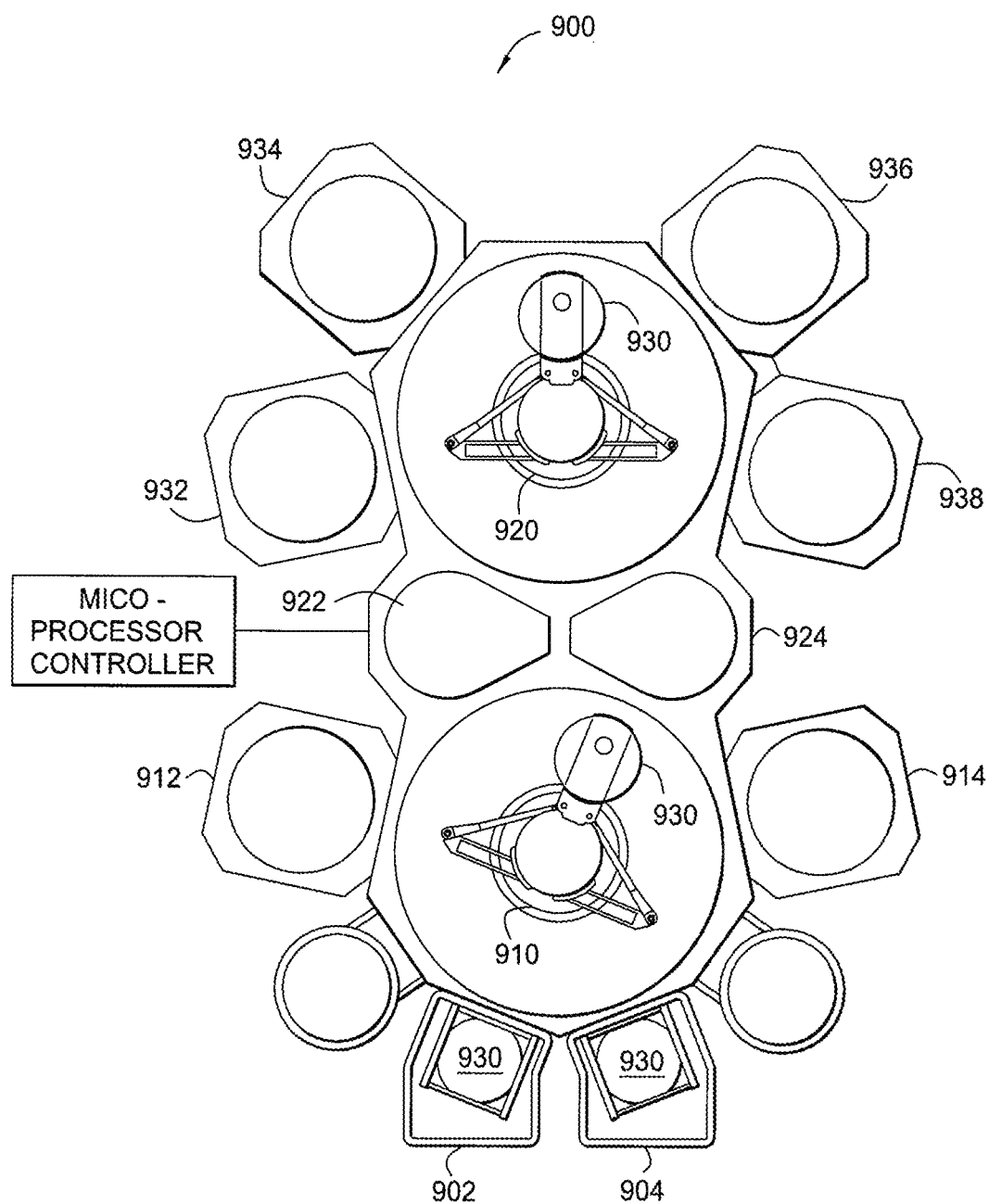
FIG. 9 is a schematic plan view diagram of an exemplary multi-chamber processing system configured to perform a plasma process on substrates, according to one or more embodiments of the invention.

FIG. 9 is a schematic plan view diagram of an exemplary multi-chamber processing system 900 configured to perform a plasma process on substrates 930, according to one or more embodiments of the invention. Multi-chamber processing system 900 includes one or more load lock chambers 902, 904 for transferring substrates 930 into and out of the vacuum portion of multi-chamber processing system 900. Consequently, load lock chambers 902, 904 can be pumped down to introduce substrates into multi-chamber processing system 900 for processing under vacuum. A first robot 910 transfers substrates 930 between load lock chambers 902 and 904, transfer chambers 922 and 924, and a first set of one or more processing chambers 912 and 914. A second robot 920 transfers substrates 930 between transfer chambers 922 and 924 and processing chambers 932, 934, 936, 938.

One or both of processing chambers 912 and 914 may be configured to perform a preparatory process, such as a cleaning process, native oxide removal process, and the like. The transfer chambers 922, 924 can be used to maintain ultrahigh vacuum conditions while substrates are transferred within multi-chamber processing system 900. One or more of processing chambers 932, 934, 936, 938 are configured to perform a plasma process on substrates 930 using multiple RF power feeds for improved uniformity, according to embodiments of the invention described herein. Exemplary cluster tools include but are not limited to the PRODUCER®, CENTURA®, ENDURA®, and ENDURA® SL platforms, available from Applied Materials, Inc., located in Santa Clara, Calif.

In summation, one or more embodiments of the present invention provide systems and methods for modifying the uniformity pattern of a thin film deposited in a plasma processing chamber. Advantages of such embodiments include the ability to improve non-radial, i.e., skewed, uniformity patterns that are difficult to alter using conventional process parameters, which generally address radial uniformity issues. In addition, radial uniformity can be improved by some embodiments described herein, thereby relaxing the standards for other process parameters and making the process associated with the plasma processing chamber more robust.

Furthermore, as devices at subsequent technology nodes are formed using a particular plasma processing chamber, different uniformity issues may arise. For example, for one thin film being deposited in the chamber, skew may be the primary uniformity issue, whereas in another film, center thickness may be the primary uniformity issue. Because embodiments provide great flexibility in altering power distribution between the multiple RF power coupling points to the discharge electrode of the plasma processing chamber, uniformity performance of the chamber can be improved without designing new chamber hardware for each different film processed therein. Instead, the equivalent of a process recipe change can be made by varying power distribution between the multiple RF power coupling points via phase adjustment thereto.

While the foregoing is directed to embodiments of the present invention, other and further embodiments of the invention may be devised without departing from the basic scope thereof, and the scope thereof is determined by the claims that follow.

We claim:

1. A processing system comprising:
  a processing chamber comprising:
    a vacuum processing region defined by a backing plate, a bottom wall, and one or more side walls connecting the bottom wall to the backing plate;
    a chamber lid having one or more sides disposed over the one or more side walls of the vacuum processing region; and
    a substrate support disposed in the vacuum processing region,
    wherein the backing plate is disposed over the substrate support, the backing plate including a first surface facing the substrate support, a second surface opposite the first surface, and one or more side surfaces connecting the first surface to the second surface; and
  a transmission line structure disposed around an outer surface of the the one or more sides of the chamber lid, the transmission line structure comprising:
    a plurality of couplings disposed at least partially outside of the chamber lid, wherein each coupling of the plurality of couplings extends through one of the one or more sides of the chamber lid to make an electrical connection with the backing plate at a different angular position around the one or more side surfaces of the backing plate;
    a first transmission line; and
    a plurality of removable segments disposed outside of the chamber lid, the plurality of removable segments electrically connecting the first transmission line to the plurality of couplings.

2. The processing chamber of claim 1, wherein the plurality of removable segments extend around the one or more sides of the processing chamber.

3. The processing chamber of claim 1, wherein
  the angular position of each coupling is adjustable around the one or more side surfaces of the backing plate, and
  the angular position of each coupling is configured to be adjusted from outside the processing chamber.

4. The processing chamber of claim 1, wherein each coupling electrically contacts the backing plate on the one or more side surfaces of the backing plate.

5. The processing chamber of claim 1, wherein each removable segment is electrically connected to two or more couplings.

6. The processing chamber of claim 1, wherein each removable segment is electrically connected to a different number of couplings.

7. The processing chamber of claim 1, wherein each removable segment has a different shape.

8. The processing chamber of claim 1, wherein each removable segment has a different size.

9. A processing system comprising:
  a processing chamber comprising:
    a vacuum processing region defined by a backing plate, a bottom wall, and one or more side walls connecting the bottom wall to the backing plate;
    a chamber lid having one or more sides disposed over the one or more side walls of the vacuum processing region; and
    a substrate support disposed in the vacuum processing region,
    wherein the backing plate is disposed over the substrate support, the backing plate including a first surface facing the substrate support, a second surface opposite the first surface, and one or more side surfaces connecting the first surface to the second surface;
  a transmission line structure disposed around an outer surface of the one or more sides of the chamber lid, the transmission line structure comprising:
    a plurality of couplings disposed at least partially outside of the chamber lid, the plurality of couplings including a first coupling, a second coupling, and a third coupling, each coupling of the plurality of couplings extending through the one or more sides of the chamber lid to make an electrical connection with the backing plate at a different angular position around the one or more side surfaces of the backing plate;
    a first transmission line; and
    a plurality of removable segments disposed outside of processing chamber, the plurality of removable segments including a first removable segment and a second removable segment, wherein the first removable segment electrically connects the first transmission line to the first coupling and the second coupling, and the second removable segment electrically connects the first transmission line to the third coupling.

10. The processing chamber of claim 9, further comprising a fourth coupling, wherein the second removable segment electrically connects the first transmission line to the fourth coupling.

11. The processing chamber of claim 9, wherein the plurality of removable segments extend around the one or more sides of the processing chamber.

12. The processing chamber of claim 9, wherein
the first removable segment includes a first section and a second section extending from a midpoint,
the first section extends from the midpoint to the first coupling, and
the second section extends from the midpoint to the second coupling.

13. The processing chamber of claim 9, wherein
the angular position of each coupling is adjustable around the one or more side surfaces of the backing plate, and
the angular position of each coupling is configured to be adjusted from outside the processing chamber.

14. The processing chamber of claim 9, wherein each coupling electrically contacts the backing plate on the one or more side surfaces of the backing plate.

15. The processing chamber of claim 9, wherein each removable segment has a different shape.

16. The processing chamber of claim 9, wherein each removable segment has a different size.

17. A processing system comprising:
a processing chamber comprising:
a vacuum processing region defined by a backing plate, a bottom wall, and one or more side walls connecting the bottom wall to the backing plate;
a chamber lid having one or more sides disposed over the one or more side walls of the vacuum processing region; and
a substrate support disposed in the vacuum processing region,
wherein the backing plate is disposed over the substrate support, the backing plate including a first surface facing the substrate support, a second surface opposite the first surface, and one or more side surfaces connecting the first surface to the second surface;
a transmission line structure disposed around an outer surface of the one or more sides of the chamber lid, the transmission line structure comprising:
a plurality of couplings disposed at least partially outside of the chamber lid, the plurality of couplings including a first coupling, a second coupling, and a third coupling, each coupling of the plurality of couplings extending through the one or more sides of the chamber lid to make an electrical connection with the backing plate at a different position;
a first transmission line; and
a plurality of removable segments disposed outside of the chamber lid, the plurality of removable segments including a first removable segment and a second removable segment, wherein
the first removable segment electrically connects the first transmission line to the first coupling and the second coupling, and
the second removable segment electrically connects the first transmission line to the third coupling.

* * * * *